(12) United States Patent
Miura et al.

(10) Patent No.: US 9,312,422 B2
(45) Date of Patent: Apr. 12, 2016

(54) LIGHT RECEIVING ELEMENT, SEMICONDUCTOR EPITAXIAL WAFER, METHOD FOR MANUFACTURING THE LIGHT RECEIVING ELEMENT, METHOD FOR MANUFACTURING THE SEMICONDUCTOR EPITAXIAL WAFER, AND DETECTING DEVICE

(75) Inventors: Kohei Miura, Osaka (JP); Hiroshi Inada, Osaka (JP); Yasuhiro Iguchi, Osaka (JP); Tadashi Saito, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 26 days.

(21) Appl. No.: 13/991,129

(22) PCT Filed: Nov. 29, 2011

(86) PCT No.: PCT/JP2011/077481
§ 371 (c)(1),
(2), (4) Date: May 31, 2013

(87) PCT Pub. No.: WO2012/073934
PCT Pub. Date: Jun. 7, 2012

(65) Prior Publication Data
US 2013/0248821 A1    Sep. 26, 2013

(30) Foreign Application Priority Data

Dec. 1, 2010  (JP) ................................. 2010-268614
May 18, 2011  (WO) .................. PCT/JP2011/061407
Nov. 14, 2011  (JP) ................................. 2011-248788

(51) Int. Cl.
*H01L 29/06* (2006.01)
*H01L 31/109* (2006.01)
*B82Y 20/00* (2011.01)
*H01L 27/144* (2006.01)
(Continued)

(52) U.S. Cl.
CPC ............... *H01L 31/109* (2013.01); *B82Y 20/00* (2013.01); *H01L 21/02392* (2013.01);
(Continued)

(58) Field of Classification Search
CPC ..................... H01L 2924/00; H01L 21/02546; H01L 21/02463; H01L 21/02549; H01L 29/205; H01L 31/035236; H01L 31/0687; H01L 21/02466; H01L 2924/0002; H01L 31/03046; Y02E 10/544; Y02E 10/50; Y02E 10/547
See application file for complete search history.

(56) References Cited

U.S. PATENT DOCUMENTS

2002/0070416 A1*  6/2002 Morse et al. ................... 257/443
2007/0160100 A1*  7/2007 Huffaker et al. ............ 372/45.01
(Continued)

FOREIGN PATENT DOCUMENTS

| JP | 61-239679 | 10/1986 |
|---|---|---|
| JP | 2003-173977 | 6/2003 |
| JP | 2010-157667 | 7/2010 |

OTHER PUBLICATIONS

Takahashi et al., "The Noble InGaAs Photodiodes for Near Infrared Detection," Optronics, No. 3, pp. 107-113 (1997).
(Continued)

*Primary Examiner* — Robert Bachner
(74) *Attorney, Agent, or Firm* — Venable LLP; Michael A. Sartori; Tamatane J. Aga (57) ABSTRACT

A light receiving element includes an InP substrate that is transparent to light having a wavelength of 3 to 12 μm, a buffer layer located in contact with the InP substrate, and a light-receiving layer having a multiple quantum well structure, the light-receiving layer having a cutoff wavelength of 3 μm or more and being lattice-matched with the buffer layer. In the light receiving element, the buffer layer is epitaxially grown on the InP substrate while the buffer layer and the InP substrate exceed a range of a normal lattice-matching condition, and the buffer layer is constituted by a GaSb layer.

13 Claims, 7 Drawing Sheets (51) Int. Cl.
   *H01L 31/0352*   (2006.01)
   *H01L 31/075*    (2012.01)
   *H01L 21/02*     (2006.01)
   *H01L 31/0304*   (2006.01)
   *H01L 31/105*    (2006.01)
   *H01L 31/18*     (2006.01)
   *H01L 27/146*    (2006.01)

(52) U.S. Cl.
   CPC ... *H01L 21/02463* (2013.01); *H01L 21/02466* (2013.01); *H01L 21/02505* (2013.01); *H01L 21/02546* (2013.01); *H01L 21/02549* (2013.01); *H01L 27/1446* (2013.01); *H01L 27/1464* (2013.01); *H01L 31/0304* (2013.01); *H01L 31/035236* (2013.01); *H01L 31/075* (2013.01); *H01L 31/105* (2013.01); *H01L 31/184* (2013.01); *Y02E 10/544* (2013.01); *Y02E 10/548* (2013.01); *Y02P 70/521* (2015.11)

(56) References Cited

U.S. PATENT DOCUMENTS

| | | | |
|---|---|---|---|
| 2008/0157058 A1* | 7/2008 | Hudait et al. | 257/14 |
| 2008/0240174 A1* | 10/2008 | Brueck et al. | 372/20 |
| 2009/0224229 A1* | 9/2009 | Razeghi | 257/21 |
| 2010/0159631 A1* | 6/2010 | Maimon | 438/72 |
| 2010/0171097 A1* | 7/2010 | Nagai et al. | 257/21 |
| 2011/0204214 A1* | 8/2011 | Bahir et al. | 250/214.1 |

OTHER PUBLICATIONS

Sidhu et al., "A 2.3μm Cutoff Wavelength Photodiode on InP Using Lattice-Matched GaInAs—GaAsSb Type-II Quantum Wells," 2005 International Conference on Indium Phosphide and Related Materials, pp. 148-151 (2005).

Kim et al., "Mid-IR Focal Plane Array Based on Type-II InAs/GaSb Strain Layer Superlattice Detector With *nBn* Design," Applied Physics Letters, No. 92, pp. 183502-1-183502-3 (2008).

Nguyen et al., "Very High Quantum Efficiency in Type-II InAs/GaSb Superlattice Photodiode With Cutoff of 12μm," Applied Physics Letters, No. 90, pp. 231108-1-231108-3 (2007).

Rodriguez et al., "*nBn* Structure Based on InAs/GaSb Type-II Strained Layer Supperlattices," Applied Physics Letters, No. 91, pp. 043514-1-043514-2 (2007).

International Search Report in International Patent Application No. PCT/JP2011/077481 dated Feb. 28, 2012.

* cited by examiner

LIGHT RECEIVING ELEMENT, SEMICONDUCTOR EPITAXIAL WAFER, METHOD FOR MANUFACTURING THE LIGHT RECEIVING ELEMENT, METHOD FOR MANUFACTURING THE SEMICONDUCTOR EPITAXIAL WAFER, AND DETECTING DEVICE

TECHNICAL FIELD

The present invention relates to a light receiving element, a semiconductor epitaxial wafer, and a detecting device, all of which receive light in the near- to mid-infrared region, a method for manufacturing the light receiving element, and a method for manufacturing the semiconductor epitaxial wafer.

BACKGROUND ART

Light in the near- to mid-infrared region corresponds to an absorption spectrum region related to biological objects such as plants and animals and the environment. Therefore, the development of a photodetector in the near- to mid-infrared region, the photodetector including a light-receiving layer composed of a group III-V compound semiconductor, has been conducted. A known example of a detector that converts photo-induced charge into an output signal includes a light receiving element array in which the responsivity is extended to a wavelength of 2.6 µm by using extended-InGaAs as a light-receiving layer, and a complementary metal-oxide semiconductor (CMOS) functioning as a read-out integrated circuit (ROIC) is connected to the light receiving element array (NPL 1). The light receiving element array includes a window layer composed of InAsP that is lattice-matched with the InGaAs light-receiving layer.

It has also been reported that a p-i-n-type photodiode including a light-receiving layer having a type-II multiple quantum well structure (MQW) composed of InGaAs/GaAsSb and a p-type pixel region has a responsivity up to a wavelength of 2.5 µm (NPL 2).

A light receiving element including a GaSb substrate and a light-receiving layer provided on the GaSb substrate, the light-receiving layer having a type-II MQW composed of (InAs/GaSb) has also been proposed (NPL 3). It is described that this light receiving element has a responsivity up to a wavelength of close to 12 µm.

A light receiving element having an n-B-n (n-type layer/barrier layer/n-type layer) structure in which a light-receiving layer having a type-II MQW composed of (InAs/GaSb) is provided on a GaSb substrate and a barrier layer is arranged in the middle of the light-receiving layer has also been proposed (NPL 4). As compared with the p-i-n structure, the n-B-n structure is advantageous in that, since diffusion of a hole is used for detecting light, the depth of mesa etching for pixel isolation can be made small and a noise current flowing in a side wall of a mesa structure can be reduced.

CITATION LIST

Non Patent Literature

NPL 1: Hideo Takahashi, et al., "InGaAs photodetector for near-infrared", OPTRONICS (1997), No. 3, pp. 107-113

NPL 2: R. Sidhu, N. Duan, J. C. Campbell, and A. L. Holmes, Jr., "A 2.3 µm cutoff wavelength photodiode on InP using lattice-matched GaInAs—GaAsSb type II quantum wells" 2005 International Conference on Indium Phosphide and Related Materials NPL 3: Binh-Minh Nguyen, Darin Hoffman, Yajun Wei, Pierre-Yves Delaunay, Andrew Hood, and Manijeh Razeghi, "Very high quantum efficiency in type-II InAs/GaSb superlattice photodiode with cutoff of 12 µm" Appl. Phys. Lett., Vol. 90, 231108

NPL 4: H. S. Kim, E. Plis, J. B. Rodriguez, G. D. Bishop, Y. D. Sharma, L. R. Dawson, S. Krishna, J. Bundas, R. Cook, D. Burrows, R. Dennis, K. Patnaude, A. Reisinger, and M. Sundaram, "Mid-IR focal plane array based on type-II InAs/GaSb strain layer superlattice detector with nBn design" Appl. Phys. Lett., Vol. 92, 183502

DISCLOSURE OF INVENTION

Technical Problem

However, in the InGaAs photodetector (image sensor) for near-infrared described in NPL 1, the light-receiving layer is composed of InGaAs having a composition which is not lattice-matched with an InP substrate. Consequently, the dark current of the photodetector increases, thereby increasing noise. In addition, it is difficult to realize a detectable wavelength of more than 2.6 µm.

Regarding the light receiving element described in NPL 2, no example in which the responsivity reaches a wavelength of 3µm has been reported.

The light receiving element described in NPL 3 has a problem in terms of mass productivity because the GaSb substrate is expensive and the quality of the substrate significantly varies. A particularly serious problem is that, since GaSb has light absorption due to a free carrier in the mid-infrared region, the responsivity is decreased in a structure in which light is incident from the rear surface of the GaSb substrate, the structure being necessary for arrayed pixels.

The light receiving element described in NPL 4 has the same problems as in NPL 3 and has difficulty in terms of mass productivity.

An object of the present invention is to provide a light receiving element, a semiconductor epitaxial wafer used for preparing the light receiving element, and a detecting device, all of which have a high responsivity over the near- to mid-infrared region and stably have a high quality, a method for manufacturing the light receiving element, and a method for manufacturing the semiconductor epitaxial wafer.

Solution to Problem

A light receiving element according to the present invention is formed by using a group III-V compound semiconductor. The light receiving element includes an InP substrate that is transparent to light having a wavelength of 3 to 12 µm, a buffer layer located in contact with the InP substrate, and a light-receiving layer having a multiple quantum well structure and located in contact with the buffer layer. The light-receiving layer has a cutoff wavelength of 3 µm or more and is lattice-matched with the buffer layer. The buffer layer is epitaxially grown on the InP substrate while a value of $|a_2-a_1|/a_1$ exceeds a range of a normal lattice-matching condition, where $a_2$ represents a lattice parameter of the buffer layer and $a_1$ represents a lattice parameter of the InP substrate, and the buffer layer is constituted by a GaSb layer.

In a group III-V compound semiconductor, a lattice parameter is changed by changing the composition of elements. Accordingly, in general, the composition of an epitaxial layer is finely changed such that a lattice parameter of the epitaxial layer is matched with a lattice parameter of an underlayer when the epitaxial layer is grown. Thus, a layered body of a group III-V compound semiconductor having a low lattice defect density is formed, and a dark current, which is one of the most important indices in a light receiving element, can be reduced. Reducing the lattice defect density is necessary in order to obtain a certain level of characteristics not only in light receiving elements but also other semiconductor elements. Reflecting these circumstances specific to group III-V compound semiconductors or specific to compound semiconductors that are not limited to group III-V compound semiconductors, it is assumed that a low lattice defect density is important. In this case, the degree of lattice mismatch $|s_1-s_2|/(s_2 \text{ or } s_1)$ where $s_1$ represents a lattice parameter of an underlayer and $s_2$ represents a lattice parameter of an upper layer grown on the underlayer is preferably as small as possible. For example, in InGaAs/InP-based compound semiconductors, the degree of lattice mismatch is preferably (0.002 to 0.003) or less. It is generally known that the term "lattice matching" refers to a case where the degree of lattice mismatch is 0.005 or less. Considering these together, a range of a degree of lattice mismatch of 0.005 or less can be considered to be the range of the normal lattice-matching condition. The phrase "exceeds a range of a normal lattice-matching condition" means that the degree of lattice mismatch exceeds 0.005.

However, in reality, the threshold value of the degree of lattice mismatch depends on the materials. Accordingly, in GaSb/InP-based materials, which are the focus of the present invention, a layered body of a group III-V compound semiconductor having a good crystal quality can be formed even when the degree of lattice mismatch is high. Under the lattice-matching condition determined by normally introducing only the lattice parameters, whether or not an upper layer is epitaxially grown on an underlayer cannot be determined. The present invention is an invention which is based on demonstrated data and to which such an example applies.

Herein, the reason why the phrase "the buffer layer is epitaxially grown on the InP substrate" is used without using a phrase "the buffer layer is lattice-matched with the InP substrate" is as follows. The term "lattice matching" may imply that a lattice parameter of a growth layer and a lattice parameter of a layer on which the growth layer is grown are close to each other. In order to avoid such misunderstanding, the phrase "epitaxially grown" is used. In other words, the phrase "epitaxially grown" refers to a case where a growth layer is grown at a low lattice defect density while maintaining "lattice matching" or "substantial lattice matching" even though a lattice parameter of the growth layer is significantly different from a lattice parameter of a layer on which the growth layer is grown.

According to the above structure, a buffer layer that does not match with a lattice-matching condition is formed on an InP substrate, which is known to have a good crystal quality, and a light-receiving layer having an MQW, the light-receiving layer being lattice-matched with the buffer layer, can be formed on the buffer layer. Since the bandgap of InP is 1.35 eV, the InP substrate does not absorb light in a wavelength range to be received by the light-receiving layer having a cutoff wavelength of 3 µm. The bandgap of 1.35 eV corresponds to a short wavelength of a little less than 1 µm. Therefore, in a light receiving element including two-dimensionally arrayed pixels, on which light must be incident from the rear surface of the substrate, the target light is not absorbed by the substrate and thus a high responsivity can be maintained. In the case where an MQW having a cutoff wavelength of 3 µm or more is formed, a substrate composed of a group III-V compound semiconductor having a lattice parameter larger than that of InP (lattice parameter: 5.869 Å) is typically used even in the case where the MQW is a type-II MQW. Even when the transition energy of an electron in light reception is reduced by using a type-II MQW, a substrate having a lattice parameter larger than that of InP is necessary in order to realize a long wavelength (small transition energy) of a cutoff wavelength of 3 µm. A substrate having a lattice parameter larger than that of an InP substrate absorbs light in the near- to mid-infrared region due to various factors including the large lattice parameter. Since the substrate has a large thickness, the absorption of target light by the substrate causes a significant decrease in the responsivity.

By interposing a buffer layer composed of GaSb as described above, an MQW having a cutoff wavelength of 3 µm or more is formed on an InP substrate, and thus a light receiving element having a high responsivity in the near- to mid-infrared region can be obtained. An InP substrate having a good crystal quality can be stably obtained, as described above. Accordingly, even if the lattice defect density is taken over to an upper layer, an MQW having a good crystal quality can be stably obtained and the dark current can be reduced. The stable, good crystal quality of an InP substrate makes characteristics of the resulting light receiving element uniform and improves the yield. Furthermore, an InP substrate is excellent in terms of mass productivity because it is possible to obtain a substrate having a diameter larger than the diameters of substrates composed of other group III-V compound semiconductors.

In the case where an MQW is formed by repeating a pair of an a layer and a b layer, the lattice parameter of the MQW is determined by a periodicity of an X-ray diffraction (XRD) pattern. The lattice parameter of the buffer layer is the average over the entire thickness of a buffer layer having a predetermined thickness and grown on an InP substrate, but is substantially the same as a lattice parameter specific to the material, the lattice parameter being described in a handbook or the like.

The buffer layer is constituted by a GaSb layer. Alternatively, the buffer layer may be a layer having the same crystal properties as a GaSb layer in terms of the relationship with an InP substrate (hereinafter, referred to as "a layer equivalent to a GaSb layer"). Herein, the phrase "having the same crystal properties as a GaSb layer in terms of the relationship with an InP substrate (hereinafter, referred to as "a layer equivalent to a GaSb layer")" means that the layer contains Sb, has a lattice parameter substantially the same as that of a GaSb layer, and is epitaxially grown in the manner described above, though the lattice-matching condition with an InP substrate deviates from the range of the normal lattice-matching condition. The phrase further means that a light-receiving layer can be formed on the layer equivalent to a GaSb layer so as to be lattice-matched with the layer.

With this structure, a light-receiving layer having a responsivity on the long-wavelength side can be epitaxially grown on an InP substrate with a GaSb (lattice parameter $a_2$=6.095 Å) layer or a layer equivalent to a GaSb layer therebetween, the GaSb layer or layer equivalent to a GaSb layer having a lattice parameter larger than a lattice parameter of InP (lattice parameter $a_1$=5.869 Å). The thickness of the buffer layer is not particularly limited but is preferably 0.2 µm or more. When the thickness of the buffer layer is less than 0.2 µm, the following problem occurs. Specifically, in the case where a ground electrode is provided in a buffer layer, when epitaxial layers are etched from an upper layer to a position corresponding to a predetermined thickness of the buffer layer, it is necessary to stop the etching in the buffer layer. When the thickness of the buffer layer is less than 0.2 µm, the etching stop position is not located within a range of variation in the etching stop. The upper limit of the thickness of the buffer layer is 1 µm or more, and preferably 1.5 µm or more or 2 µm or more because the crystal quality of the surface layer can be made good when the buffer layer has a larger thickness within a predetermined range.

From the standpoint of the relationship with a critical film thickness in InP/GaSb, a thickness of the buffer layer of 0.2 µm or more is significantly larger than the critical film thickness, which will be described in detail in the embodiments. When the degree of lattice mismatch is 0.038, the critical film thickness is estimated to be about 4 nm (0.004 µm) at most. Accordingly, the thickness of the buffer layer is several tens times the critical film thickness. The GaSb buffer layer has a thickness at least 50 times the critical film thickness. The thickness of the GaSb buffer layer may be 100 times or more the critical film thickness. It is believed that this is because specific properties such as a surfactant effect of Sb are also related.

From the standpoint of lattice matching, the InP substrate/buffer layer constituted by a GaSb layer or a layer equivalent to a GaSb layer is considered to function as an alternative to a GaSb substrate. However, in the case where a GaSb substrate is used, the GaSb substrate receives light targeted by the light-receiving layer because GaSb has light absorption due to a free carrier in the mid-infrared region. Since the substrate has a large thickness, the absorption of target light by the GaSb substrate causes a significant decrease in the responsivity. As described above, since an InP substrate does not absorb light having a wavelength of 3 µm or more, a good responsivity can be maintained.

Since an InP substrate stably has a good crystal quality compared with a GaSb substrate, characteristics of the resulting light receiving element can be made uniform and the yield can be improved. An InP substrate is excellent in terms of mass productivity because it is possible to obtain an InP substrate having a diameter larger than that of a GaSb substrate. Furthermore, an InP substrate is very inexpensive, and thus a high-quality light receiving element having high economical efficiency can be provided.

The InP substrate that is transparent to light having a wavelength of 3 to 12 µm is preferably an InP substrate to which sulfur (S) is not added.

The transmittance of an InP substrate containing sulfur (S) is decreased from a wavelength of 3 µm or more, becomes close to almost zero at a wavelength of 5 µm, and becomes zero at a wavelength of 5 µm or more. Therefore, a sulfur-free InP substrate is used as the InP substrate.

The InP substrate that is transparent to light having a wavelength of 3 to 12 µm is particularly preferably an Fe-containing InP substrate or an undoped InP substrate.

When an Fe-containing InP substrate or an undoped InP substrate is used, the InP substrate is transparent to light having a wavelength of 3 to 12 µm, thus enhancing the responsivity of the light receiving element of the present invention, which receives light in this wavelength range.

The light-receiving layer may have a p-n junction therein.

With this structure, it is possible to provide a light receiving element for the infrared region, the light receiving element having a p-i-n structure and a high responsivity.

The light-receiving layer may include an insertion layer that is composed of a group III-V compound semiconductor and that is lattice-matched with the light-receiving layer, and a bottom of a conduction band of the insertion layer may be higher than a bottom of a conduction band of the light-receiving layer.

With this structure, it is possible to provide a light receiving element for the infrared region, the light receiving element having a high responsivity and an n-B-n (n-type layer/barrier layer/n-type layer) structure. In addition, the leak current can be reduced while reliably achieving the independence of pixels.

The multiple quantum well structure in the light-receiving layer of the light receiving element may be a type-II MQW selected from {(InAs/GaSb), (InAs/InGaSb), (InAsSb/GaSb), and (InAsSb/InGaSb)}.

With this structure, the light receiving element can include a light-receiving layer having a responsivity in the near- to mid-infrared region (at a wavelength of 3 to 12 µm). Note that the lattice parameter of InAs is 6.058 Å, the lattice parameter of GaSb is 6.095 Å, the lattice parameter of $In_{0.2}Ga_{0.8}Sb$ is 6.172 Å, and the lattice parameter of $InAs_{0.92}Sb_{0.08}$ is 6.092 Å.

The light receiving element may have a structure in which light is incident from a rear surface of the InP substrate.

With this structure in which the rear surface of the InP substrate functions as an incident surface, it is possible to obtain a hybrid detecting device whose size is reduced by connecting two-dimensionally arrayed light receiving elements (pixels) to read-out electrodes of an ROIC by a micro-bump bonding method so as to have a compact structure. That is to say, a compact, user-friendly hybrid detecting device cannot be obtained without using the micro-bump bonding method. Furthermore, since the InP substrate does not absorb light in the near- to mid-infrared region, a light receiving element having a high responsivity in this wavelength range can be obtained.

Herein, the structure in which light is incident from the substrate side includes, for example, an anti-reflection (AR) film provided on the rear surface of the substrate. Two-dimensionally arrayed pixels (light receiving elements) also correspond to the structure because the pixels (light receiving elements) are arranged so that light is to be incident from the rear surface of the substrate.

A detecting device according to the present invention includes any of the light receiving elements described above and a read-out integrated circuit (ROIC), in which a pixel electrode in the light receiving element is connected to a read-out electrode in the ROIC with a bump interposed therebetween.

With this structure, it is possible to obtain a compact and downsized detecting device having a high responsivity in the near- to mid-infrared region.

A semiconductor epitaxial wafer according to the present invention is formed by using a group III-V compound semiconductor. The semiconductor epitaxial wafer includes an InP substrate that is transparent to light having a wavelength of 3 to 12 µm and a buffer layer located in contact with the InP substrate. A value of $|a_2-a_1|/a_1$ exceeds a range of a normal lattice-matching condition, where $a_2$ represents a lattice parameter of the buffer layer and $a_1$ represents a lattice parameter of the InP substrate, and the buffer layer is constituted by a GaSb layer.

Regarding epitaxial growth of the group III-V compound semiconductor, and the normal lattice-matching condition, etc., the description in the light receiving element applies as it is. The technical significance of the buffer layer constituted by a GaSb layer is also the same as described above. The technical significance of the buffer layer constituted by a layer equivalent to a GaSb layer is also the same as described above.

With the above structure, an InP substrate, which is known to have a good crystal quality, is used, a buffer layer having a lattice parameter that is not believed to be lattice-matched with InP is formed using a GaSb layer or the like, and thus the crystal quality of the buffer layer can be made to be relatively good. An epitaxial layer that is lattice-matched with the buffer layer can be grown on this semiconductor epitaxial wafer. In a sense, a substrate having a lattice parameter different from InP can be realized while an InP substrate is used.

In the epitaxial wafer, the InP substrate that is transparent to light having a wavelength of 3 to 12 μm may be an Fe-containing InP substrate or an undoped InP substrate.

With this structure, a substrate having a large thickness does not absorb light having a wavelength in the range of 3 to 12 μm. Thus, the responsivity of the light receiving element according to the present invention, which receives light in this wavelength range, can be enhanced.

The epitaxial wafer may further include a first semiconductor layer having a multiple quantum well structure, the first semiconductor layer being lattice-matched with the buffer layer.

With this structure, a first semiconductor layer having a multiple quantum well structure and having a good crystal quality can be grown so as to be lattice-matched with the buffer layer. Accordingly, a light receiving element having a high responsivity in the infrared region can be obtained by using an InP substrate having a high transmittance.

The multiple quantum well structure in the first semiconductor layer of the semiconductor epitaxial wafer may be a type-II MQW selected from {(InAs/GaSb), (InAs/InGaSb), (InAsSb/GaSb), and (InAsSb/InGaSb)}.

With this structure, a semiconductor epitaxial wafer for preparing a light receiving element having a high responsivity in the near- to mid-infrared region (at a wavelength of 3 to 12 μm) can be provided.

In a method for manufacturing a light receiving element according to the present invention, a light receiving element in which a group III-V compound semiconductor is stacked on an InP substrate is produced. This method includes the steps of preparing an InP substrate that is transparent to light having a wavelength of 3 to 12 μm, forming a buffer layer in contact with the InP substrate, and forming a light-receiving layer including a multiple quantum well structure and having a cutoff wavelength of 3 μm or more, the light-receiving layer being located in contact with the buffer layer and lattice-matched with the buffer layer. In the step of forming a buffer layer, the buffer layer is epitaxially grown from the InP substrate while a lattice parameter $a_2$ of the buffer layer and a lattice parameter $a_1$ of the InP substrate exceed a range of a normal lattice-matching condition, and the buffer layer is constituted by a GaSb layer.

According to the above method, by using, as a buffer layer, a GaSb layer or the like which is believed to be a material that is not lattice-matched with an InP substrate, it is possible to form a buffer layer having a good crystal quality to such an extent that an MQW can be epitaxially grown on an InP substrate. As a result, a light receiving element having a high responsivity at a wavelength of 3 μm or more can be obtained for the reason described above. In addition, an InP substrate which has a large diameter and which stably have a good crystal quality is available, and thus a high-quality light receiving element having high economical efficiency can be provided. Note that, as described above, the buffer layer may be constituted by a layer equivalent to a GaSb layer.

In the method for manufacturing a light receiving element, the multiple quantum well structure in the light-receiving layer may be a type-II MQW selected from {(InAs/GaSb), (InAs/InGaSb), (InAsSb/GaSb), and (InAsSb/InGaSb)}.

According to this method, a light receiving element having a high responsivity in the near- to mid-infrared region (at a wavelength of 3 to 12 μm) can be easily produced.

In the step of forming a light-receiving layer, a p-n junction may be formed in the light-receiving layer.

According to this method, it is possible to provide a light receiving element for the infrared region, the light receiving element having a p-i-n structure and a high responsivity.

In the step of forming a light-receiving layer, an insertion layer that is composed of a group III-V compound semiconductor and that is lattice-matched with the light-receiving layer may be inserted in the light-receiving layer, and a bottom of a conduction band of the insertion layer may be higher than a bottom of a conduction band of the light-receiving layer.

According to this method, a light receiving element for the infrared region, the light receiving element having an n-B-n (n-type layer/barrier layer/n-type layer) structure and a high responsivity can be produced while reducing a leak current by reducing the depth of a trench of a mesa structure.

In a method for manufacturing a semiconductor epitaxial wafer according to the present invention, a semiconductor epitaxial wafer in which a group III-V compound semiconductor is stacked on an InP substrate is produced. This method includes the steps of preparing an InP substrate that is transparent to light having a wavelength of 3 to 12 μm and forming a buffer layer in contact with the InP substrate. In the step of forming a buffer layer, the buffer layer is epitaxially grown from the InP substrate while a lattice parameter $a_2$ of the buffer layer and a lattice parameter $a_1$ of the InP substrate exceed a range of a normal lattice-matching condition, and the buffer layer is constituted by a GaSb layer.

According to the above method, an InP substrate, which is known to have a good crystal quality, is used, and a buffer layer is formed using a material, such as GaSb, having a lattice parameter significantly different from InP. Thus, it is possible to obtain a buffer layer having a relatively good crystal quality while the lattice-matching condition significantly deviates from the range of the normal lattice-matching condition. The thickness of the buffer layer is not particularly limited but may be, for example, 0.2 μm or more. The thickness of the buffer layer may be 1.5 μm or more, and furthermore, 2 μm or more. An epitaxial layer that is lattice-matched with the buffer layer can be grown on this semiconductor epitaxial wafer. Note that, as described above, the buffer layer may be constituted by a layer equivalent to a GaSb layer.

Advantageous Effects of Invention

According to the light receiving element etc. of the present invention, a light-receiving layer having a cutoff wavelength of 3 μm or more is obtained, and since an InP substrate is used, the substrate does not absorb light in the target wavelength range. Therefore, it is possible to obtain a light receiving element having a high responsivity in a wavelength range of 3 μm or more. Since an InP substrate stably has a good crystal quality, a high-quality light receiving element etc. can be stably obtained. Furthermore, the light receiving element etc. of the present invention are excellent in terms of mass productivity because an InP substrate having a large diameter can be obtained.

REFERENCE SIGNS LIST

1 InP substrate, 1 a semiconductor epitaxial wafer, 2 GaSb buffer layer, 3 light-receiving layer, 5 n-type contact layer, 6 n-type region, 9 bump of light receiving element, 10 light receiving element, 11 pixel electrode, 12 ground electrode, 12e wiring electrode, 15 p-n junction, 21 n⁺-type MQW, 22 n-type MQW, 23 barrier layer, 24 n'-type MQW, 35 anti-reflection film, 36 selective diffusion mask pattern, 43 protective film, 50 hybrid detecting device, 55 p-type contact layer, 70 read-out integrated circuit, 71 read-out electrode, 72 ground electrode, 73 insulating film, 79 bump, 101 InP (100) substrate doped with Fe, P pixel.

DESCRIPTION OF EMBODIMENTS (Embodiment 1)

Figure 1A:
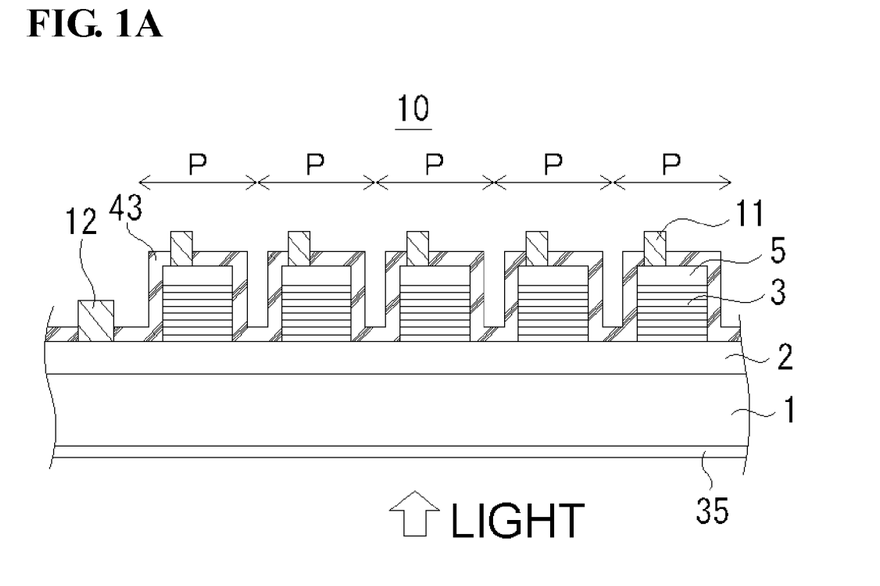
FIG. 1A shows a light receiving element according to Embodiment 1 of the present invention, and is a view showing a light receiving element including two-dimensionally arrayed pixels.
Figure 1B:
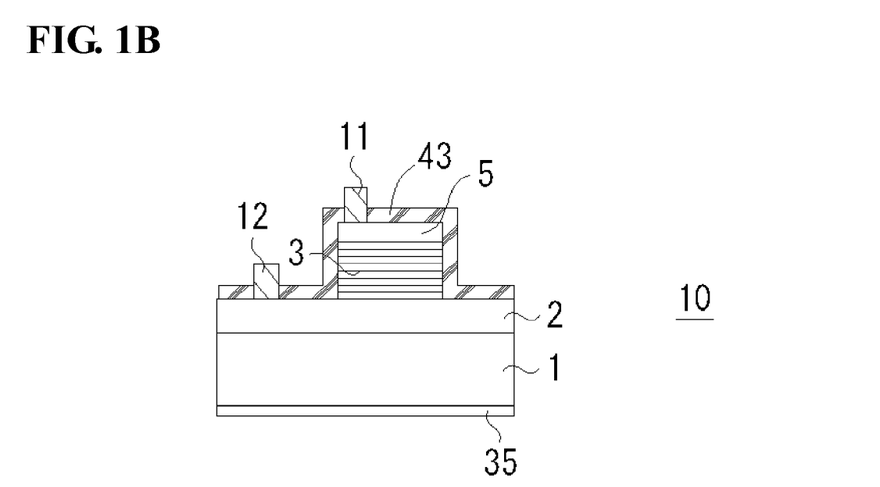
FIG. 1B shows a light receiving element according to Embodiment 1 of the present invention, and is a view showing a light receiving element including a single pixel.

FIG. 1A is a view showing a light receiving element 10 according to Embodiment 1 of the present invention, and shows a light receiving element in which pixels are two-dimensionally arrayed. FIG. 1B is a view showing a light receiving element including a single pixel. These light receiving elements are each a light receiving element of the present invention. The description of the light receiving element including two-dimensionally arrayed pixels covers the description of the light receiving element including a single pixel. Therefore, a description will now be made of the light receiving element including two-dimensionally arrayed pixels.

Referring to FIG. 1A, the light receiving element 10 includes the following group III-V semiconductor layered structure:
<InP substrate 1/p-type GaSb buffer layer 2/type II (InAs/GaSb) MQW/n-type contact layer 5>

Among these, the type II (InAs/GaSb) MQW functions as a light-receiving layer 3. The MQW has a cutoff wavelength of 3 µm or more and has a responsivity to light in the near- to mid-infrared region (having, for example, a wavelength of 3 to 12 µm). Regarding this MQW, for example, a unit of (InAs/GaSb) constitutes one pair, and about 100 to 300 pairs of (InAs/GaSb) are preferably formed. The thicknesses of the InAs and GaSb layers are each preferably in the range of 2 to 7 nm, for example, about 5 nm. Among the layers constituting the MQW, GaSb layers forming several tens of pairs on the InP substrate 1 side are preferably doped with a p-type impurity such as Be. Among the layers constituting the MQW, InAs layers forming several tens of pairs on the contact layer 5 side are preferably doped with an n-type impurity such as Si so that the several tens of pairs on the contact layer 5 side become n-type layers. Intermediate layers between the several tens of pairs on the InP substrate 1 side and the several tens of pairs on the contact layer 5 side are not doped with an impurity so that the intermediate layers become i-type (intrinsic-type) layers. By forming these conductivity type regions in the MQW, a p-i-n photodiode can be produced.

A p-n junction or a p-i-n junction is formed in the MQW 3 by the doping or undoping of an impurity.

An electrode 11 of a pixel P is preferably composed of, for example, an AuGeNi alloy so as to establish ohmic contact with the n-type contact layer 5. A ground electrode 12 is preferably composed of, for example, a Ti/Pt/Au alloy so as to establish ohmic contact with a p-type GaSb buffer layer 2. In this structure, since the electrode is formed on the buffer layer, the buffer layer preferably has a carrier concentration of 1E18 cm⁻³ or more.

Light is incident from the rear surface of the InP substrate 1. An anti-reflection (AR) film 35 covers the rear surface of the InP substrate 1 in order to prevent the incident light from being reflected. This structure in which the AR film 35 is arranged on the rear surface of the InP substrate 1 is a structure for allowing light to be incident from the substrate side. Furthermore, since a micro-bump bonding method used for connecting to a read-out integrated circuit is employed in the two-dimensional array of the pixels P, light must be incident from the substrate side. Accordingly, this two-dimensional array of the pixels P is also the structure for allowing light to be incident from the substrate side.

Features in the present embodiment lie in the following points.

(1) A lattice parameter $a_1$ of the InP substrate 1 is 5.869 Å, and a lattice parameter $a_2$ of GaSb is 6.095 Å. Accordingly, $|a_2 - a_1|/a_1 = 0.038$ (3.8%). Although the difference in the lattice parameter between the underlayer and the upper layer is very large, the GaSb buffer layer 2 has a relatively good crystal quality and is epitaxially grown on the InP substrate. The reason for this is not clear at present. On the basis of comprehensive consideration of the results of previous studies etc., it is believed that a large thickness of the GaSb buffer layer and a specific property such as a surfactant effect of Sb are also related to the good crystal quality.

In general, the larger the degree of lattice mismatch, the smaller the thickness of a layer to be grown must be because the number of misfit dislocations increases and an epitaxial film having a good crystal quality cannot be obtained. Therefore, in the field of crystal growth, the concept of a critical film thickness is provided, and it is generally believed that an epitaxial film having a good crystal quality cannot be obtained when the epitaxial film has a film thickness equal to or larger than the critical film thickness. The critical film thickness is determined by the equation of Matthews and Blakeslee based on the mechanical equilibrium theory (for example, A. Braun et al., Journal of Crystal Growth 241 (2002) pp. 231-234) or the equation of People and Bean based on the energy equilibrium theory. A graph showing the relationship between the critical film thickness and the degree of lattice mismatch on the basis of these formulae is shown in "Masayoshi Umeno and Tetsuo Soga, Handbook of Crystal Growth (edited by Hiroshi Komatsu, Kyoritsu Shuppan Co., Ltd., 1995), p. 699". In InP/GaSb, the degree of lattice mismatch is 0.038 as described above. Referring to the graph of the Handbook of Crystal Growth, in this case, the critical film thickness is about 4 nm (0.004 µm) on the basis of the equation of People and Bean, and about 1 nm (0.001 µm) on the basis of the equation of Matthews and Blakeslee.

As described above, the thickness of the GaSb buffer layer 2 is preferably 0.2 µm or more. Accordingly, in the present embodiment, the thickness of the GaSb buffer layer 2 is several tens times the critical film thickness. Even on the basis of a critical film thickness of about 4 nm determined by the equation of People and Bean, by which the critical film thickness is calculated as a large value, the thickness of the GaSb buffer layer 2 is 50 times or more the critical film thickness. The thickness of the GaSb buffer layer 2 may be 100 times or more the critical film thickness.

The GaSb buffer layer 2 grown on the InP substrate 1 has a mirror surface, and does not have irregularities on a surface thereof and is flat. The full width at half maximum (FWHM) of a main diffraction peak of XRD is preferably 300 seconds or less. In order to reliably realize the ohmic contact, the p-type GaSb buffer layer 2 has a carrier concentration of 1E18 $cm^{-3}$ or more.

Figure 2:
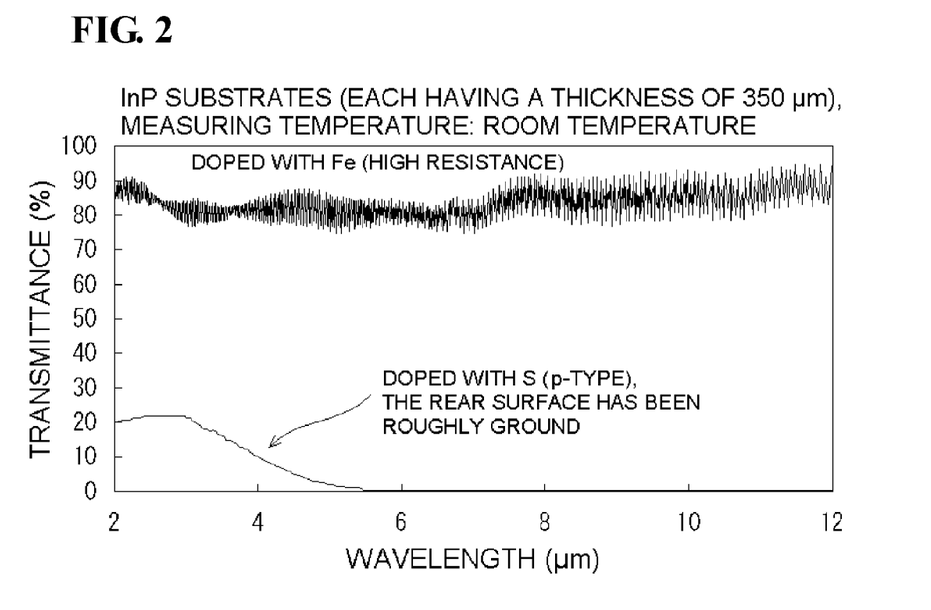
FIG. 2 is a chart showing the transmittance of InP substrates.

(2) The InP substrate 1 has a bandgap energy of 1.35 eV. This bandgap corresponds to a wavelength of a little less than 1 µm. Therefore, the InP substrate 1 does not absorb light targeted by the light-receiving layer 3. FIG. 2 is a chart showing the results of the transmittance of InP substrates each having a thickness of 350 µm, the transmittance being measured (at room temperature) with a Fourier transform infrared spectrophotometer (FT-IR). A (high-resistance) InP substrate doped with Fe is transparent in the range of a wavelength of 2 to 12 µm and does not have an absorption band in this range. FIG. 2 also shows the transmittance of an InP substrate doped with sulfur. The transmittance of this InP substrate doped with sulfur is almost zero at a wavelength of 5 µm or more. A low transmittance at a wavelength of less than 5 µm is due to the influence of rough grinding of the rear surface of the substrate. Since the transmittance is zero at a wavelength of 5 µm or more, the sulfur-containing InP substrate cannot be used as a substrate of a light receiving element for the infrared region that is targeted by the present invention.

In the case where a type-II MQW having a cutoff wavelength of 3 µm or more is formed, in general, a group III-V compound semiconductor having a lattice parameter larger than that of InP is used as the material forming the MQW. When a group III-V compound semiconductor that is lattice-matched with InP is used, a cutoff wavelength of 3 µm or more cannot be realized even in the case where the difference in transition energy of an electron in light reception is reduced by using a type-II MQW.

Figure 3:
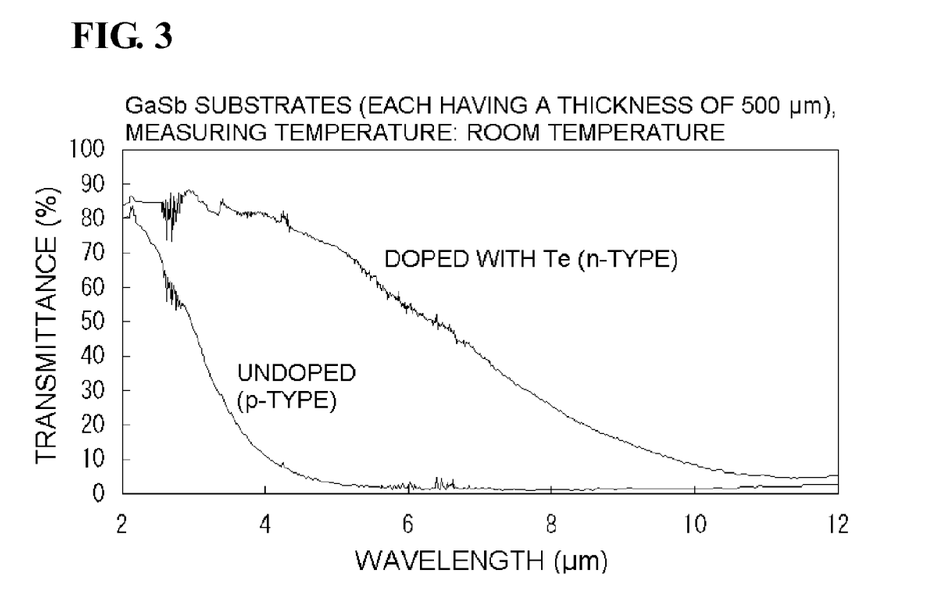
FIG. 3 is a chart showing the transmittance of GaSb substrates.

In the case where a cutoff wavelength of 3 µm or more is realized by a type-II MQW, for example, a GaSb substrate is generally used. A group III-V compound semiconductor having such a large lattice parameter often has an absorption band in a wavelength range of the near- to mid-infrared region. For example, GaSb has absorption due to a free carrier in the mid-infrared region, as shown in FIG. 3. FIG. 3 is a chart showing the results of the transmittance of GaSb substrates each having a thickness of 500 µm, the transmittance being measured (at room temperature) with an FT-IR. Referring to FIG. 3, regarding an undoped GaSb substrate, the transmittance is almost zero at a wavelength of 5 µm or more. Regarding a GaSb substrate doped with Te, the substrate having a transmittance slightly higher than that of the undoped GaSb substrate, the transmittance gradually decreases from about 70% at a wavelength of about 5 µm, becomes about 50% at a wavelength of about 6.5 µm, and decreases to 25% or less at a wavelength of 8 µm or more. It is difficult to use the GaSb substrate showing the above-described transmittance in a light receiving element that targets the infrared region. After an epitaxial wafer is produced, for example, it is necessary to remove the GaSb substrate or to significantly reduce the thickness of the GaSb substrate. In such a case, the number of steps is increased and the quality is degraded.

However, according to the above structure, the GaSb buffer layer 2 having a good crystal quality can be grown on an InP substrate, which has no absorption band in the near- to mid-infrared region, and a type-II (InAs/GaSb) MQW having a cutoff wavelength of 3 µm or more is formed on the GaSb buffer layer 2. In this case, the InP substrate 1 having a large thickness does not absorb target light. As a result, the responsivity to target light can be improved.

(3) An InP substrate having a good crystal quality can be stably obtained, compared with a GaSb substrate. Therefore, even when a structure of InP substrate 1/GaSb buffer layer 2/light-receiving layer 3 having an (InAs/GaSb) MQW is formed by epitaxial growth, a light-receiving layer 3 having an (InAs/GaSb) MQW and having a good crystal quality can be obtained at any position and in any occasion. As a result, an element having uniform characteristics can be produced with a high yield.

Furthermore, an InP substrate is excellent in terms of mass productivity because a substrate having a large diameter can be obtained compared with a GaSb substrate. Furthermore, an InP substrate is more inexpensive than a GaSb substrate. Thus, a light receiving element 10, and furthermore, a detecting device 50 that are excellent in terms of economical efficiency can be provided.

Figure 4:
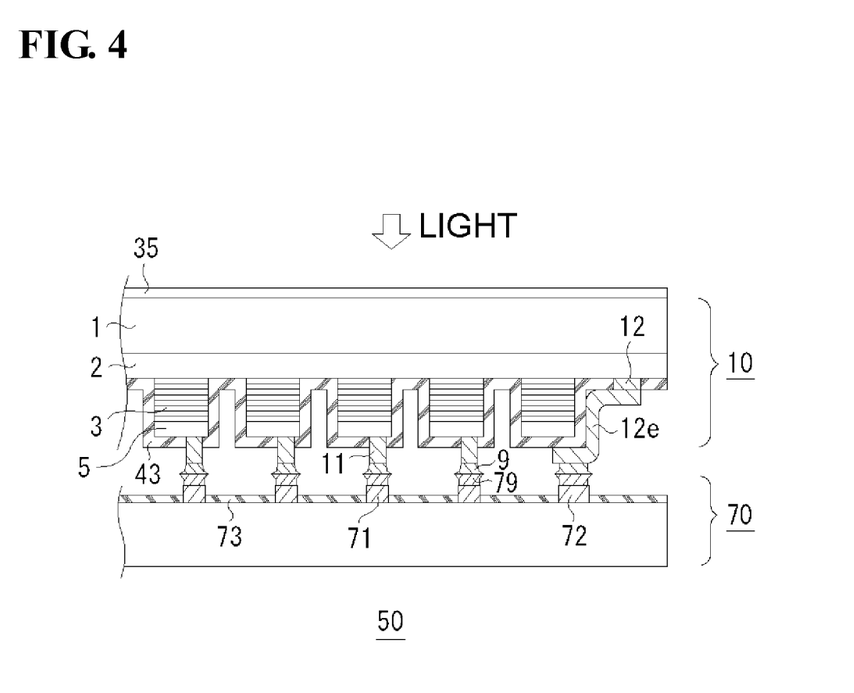
FIG. 4 is a cross-sectional view showing a hybrid detecting device in which the light receiving element shown in FIG. 1A and a read-out integrated circuit are combined.

FIG. 4 is a view showing a hybrid detecting device in which the light receiving element 10 shown in FIG. 1A is connected to a read-out integrated circuit 70 formed on silicon (Si). The read-out integrated circuit 70 is composed of a CMOS. A pixel electrode 11 that is electrically connected to an n-type contact layer 5 is electrically connected to a read-out electrode 71 with a bump 9 of the pixel electrode 11 and a bump 79 of the read-out electrode 71, the bumps 9 and 79 being interposed between the pixel electrode 11 and the read-out electrode 71. A ground electrode 12 that is electrically connected to a p-type buffer layer 2 is electrically connected to a wiring electrode 12e that extends along a protective film 43 and that has the same height as the height of the pixel electrode 11. The wiring electrode 12e is electrically connected to a ground electrode 72 of the CMOS with bumps interposed therebetween.

According to the above-described connection with a bump, the connection being established by the micro-bump bonding method, a compact and downsized detecting device can be obtained even when a pixel pitch is reduced so that pixels are arranged at a high density.

Figure 5:
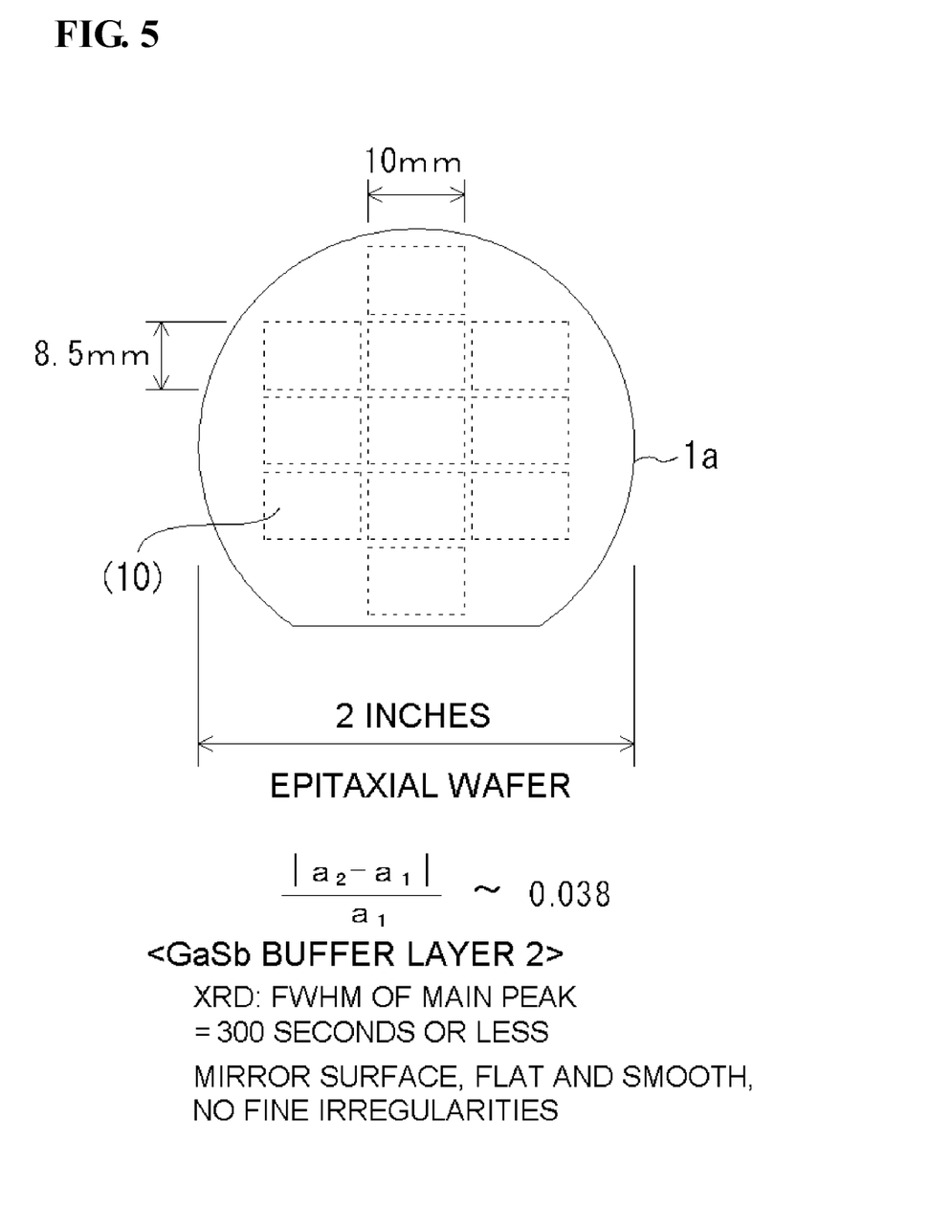
FIG. 5 is a view showing a semiconductor epitaxial wafer of the present invention.

FIG. 5 is a plan view showing a semiconductor epitaxial wafer la in the course of preparation of the light receiving element 10 shown in FIGS. 1A and 1B. In the case of a chip (light receiving element) which has a size of 8.5 mm×10 mm and in which about 80,000 pixels are arranged in the vertical direction and the horizontal direction with a 30 µm pitch, about 11 chips can be obtained from an InP substrate having a diameter of 2 inches, though it depends on the specification of the light receiving element 10. About 52 chips can be obtained from an InP substrate having a diameter of 4 inches. As described above, high mass production efficiency can be achieved by using an InP substrate having a large diameter, compared with the case where a GaSb substrate is used.

The semiconductor epitaxial wafer la shown in FIG. 5 is in a state where a GaSb buffer layer is grown on an InP substrate.

The GaSb buffer layer has a thickness of 1 μm or more, has a mirror surface, and does not have irregularities on a surface thereof and is flat. In addition, the FWHM of a main peak of XRD is 300 seconds or less. However, $|a_2-a_1|/a_1$=about 0.038 (3.8%). It is believed that this good crystal quality is due to a large thickness of the GaSb buffer layer.

The light receiving element 10 is cut out from the semiconductor epitaxial wafer 1a into pieces in a state where a light-receiving layer 3, a contact layer 5, a mesa structure, and electrodes 11 and 12 are formed thereon and the outlines of the chips substantially become clear. FIG. 5 is a view showing a state where the GaSb buffer layer 2 is formed.

Figure 6:
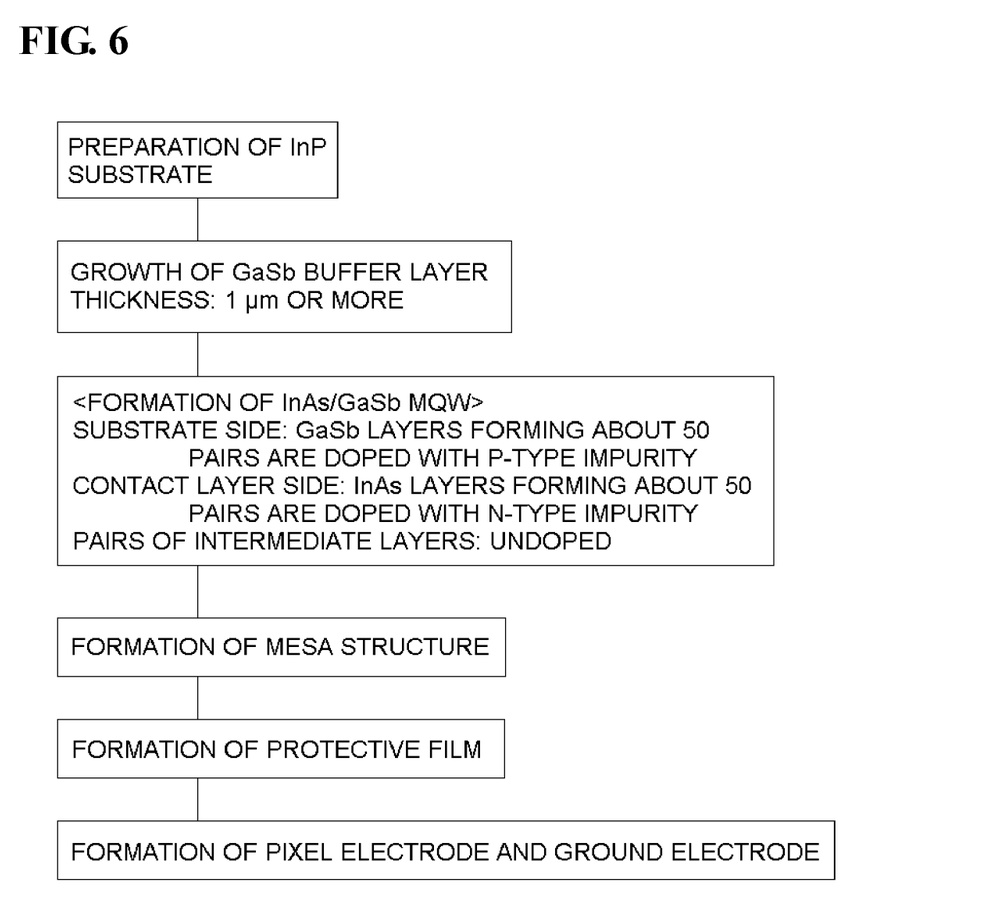
FIG. 6 is a flowchart of a method for manufacturing the light receiving element shown in FIGS. 1A and 1B.

FIG. 6 is a flowchart showing a method for manufacturing the light receiving element 10 shown in FIGS. 1A and 1B. First, an InP substrate is prepared, and washed. A GaSb buffer layer 2 is then grown on the InP substrate so as to have a thickness of 1 μm or more. The growing method is not particularly limited. For example, a molecular beam epitaxy (MBE) method or a metal organic vapor phase epitaxy (MOVPE) method can be employed. After the buffer layer is grown, a light-receiving layer 3 having a type-II (InAs/GaSb) MQW is grown. Since the transition (light reception) of type-II is conducted through the interface between InAs and GaSb, the responsivity on the long-wavelength side is increased with an increase in the number of interfaces. Therefore, in the case where the responsivity on the long-wavelength side is important, the MQW preferably includes about 150 pairs or more in total. In order to form a p-n junction in the light-receiving layer 3, i.e., MQW, GaSb layers forming about 50 pairs of the MQW on the side close to the InP substrate 1 are doped with Be, which is a p-type impurity, during the growth of the MQW. The MQW formed thereafter is undoped so as to function as an i-type (intrinsic-type) semiconductor. Subsequently, InAs layers forming the last about 50 pairs of the MQW are doped with Si, which is an n-type impurity. Thus, a p-i-n type or n-i-p type photodiode can be obtained. The p-i-n junction is also a type of p-n junction. In some structures, only a p-i junction may be present in the light-receiving layer. However, when a region with which an electrode comes in contact is also considered, the p-i junction is considered to be a p-i-n junction. This p-i-n junction can also be interpreted as a p-n junction located in the light-receiving layer.

Next, a mesa structure in which a trench is provided between pixels P is formed by etching. The etching is conducted by wet etching using phosphoric acid, hydrogen peroxide water, and water or by dry etching using hydrogen iodide or silicon chloride gas. Consequently, each pixel P becomes independent from the surrounding pixels, thereby preventing crosstalk etc. Next, as shown in FIG. 1, the surface of the mesa structure is covered with a protective film (passivation film) 43 that protects the surface. For example, a $SiO_2$ film may be used as the protective film (passivation film) 43.

Subsequently, a pixel electrode 11 and a ground electrode 12 are formed by photolithography.

The light receiving element 10 includes the InP substrate 1, the GaSb buffer layer 2 provided on the InP substrate 1, and the light-receiving layer 3 provided on the GaSb buffer layer 2, the light-receiving layer 3 having a type-II (InAs/GaSb) MQW and having a cutoff wavelength of 3 μm or more. Accordingly, even in the case where light is incident from the rear surface of the substrate, the responsivity can be increased because the InP substrate 1 having a large thickness does not absorb light having a target wavelength.

By using an InP substrate having a good crystal quality, the light-receiving layer 3 having a type-II (InAs/GaSb) MQW having a low lattice defect density can be obtained, though the reason for this is not exactly clear. Thus, the dark current of the light receiving element can be reduced.

Furthermore, since an InP substrate is more inexpensive than GaSb, it is possible to provide a light receiving element and a detecting device that are excellent in terms of economical efficiency.

(Embodiment 2)

Figure 7:
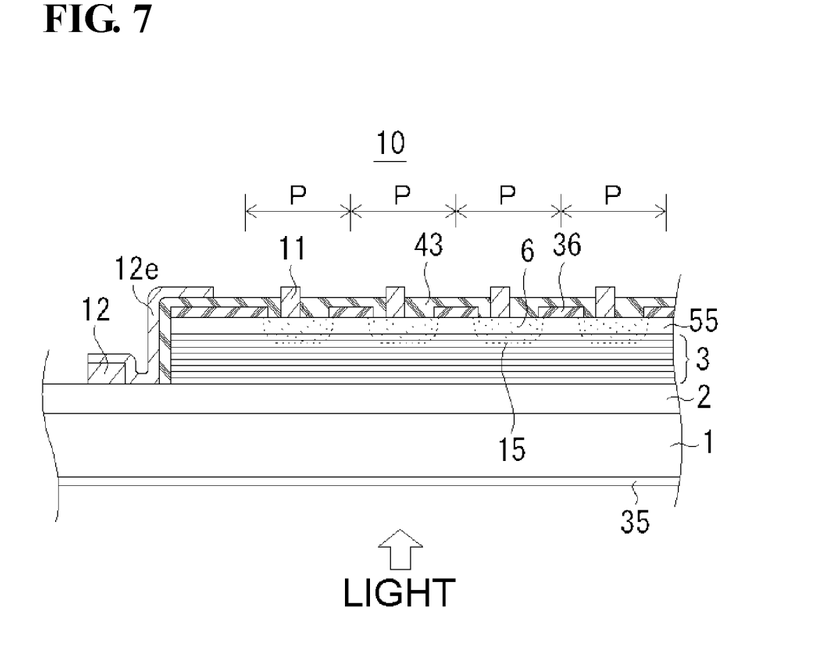
FIG. 7 is a cross-sectional view showing a light receiving element according to Embodiment 2 of the present invention.

FIG. 7 is a cross-sectional view showing a light receiving element 10 according to Embodiment 2 of the present invention. In this light receiving element 10, pixels P each include, as main portions, an n-type region 6 formed by selective diffusion from an opening of a SiN selective diffusion mask pattern 36, and a p-n junction 15 located on the leading end of the n-type region 6. The p-n junction 15 reaches the inside of a light-receiving layer 3. As described above, the p-n junction 15 may be a p-i junction. Each of the pixels P is isolated from surrounding pixels by a region that is not subjected to the selective diffusion.

The layered structure of the group III-V compound semiconductor is <InP substrate 1/p-type GaSb buffer layer 2/light-receiving layer 3 having type II (InAs/GaSb) MQW/p-type contact layer 55>. In the present embodiment, a region with which a pixel electrode 11 comes in contact is the n-type region 6 in which an n-type impurity is selectively diffused. The pixels P are isolated from each other by a region that is not subjected to the selective diffusion and crystal layers maintain the states as they are. Accordingly, unlike a mesa structure, side walls of the pixels are not exposed, and thus crystals are not easily damaged. As a result, a low dark current is easily realized.

Regarding other structures and operations, the description in Embodiment 1 applies to the present embodiment as it is.

(Embodiment 3)

Figure 8A:
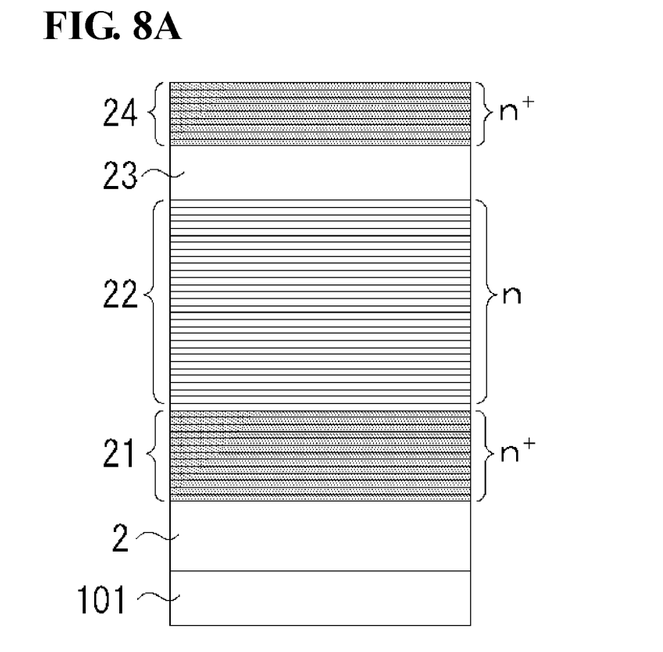
FIG. 8A shows an epitaxial wafer according to Embodiment 3 of the present invention.
Figure 8B:
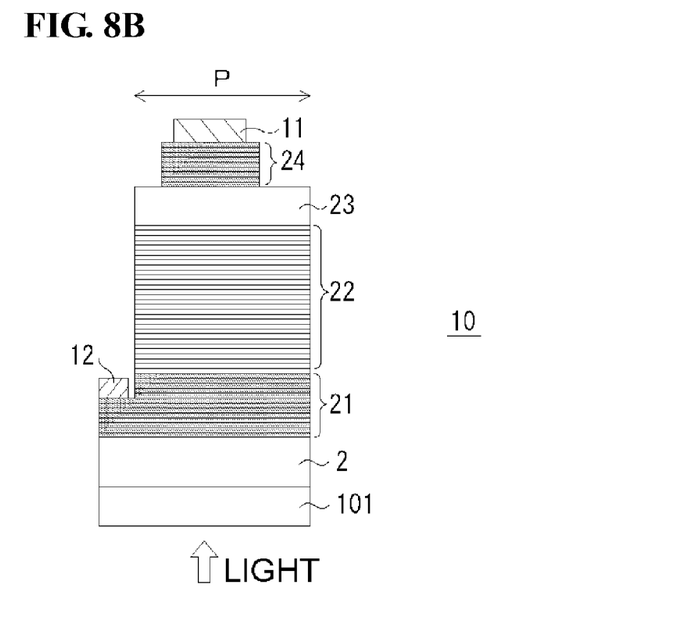
FIG. 8B shows a light receiving element according to Embodiment 3 of the present invention.

FIG. 8A is a cross-sectional view showing an epitaxial wafer according to Embodiment 3 of the present invention, and FIG. 8B is a cross-sectional view showing a light receiving element 10 according to Embodiment 3 of the present invention. The epitaxial wafer shown in FIG. 8A has the following layered structure.

<InP (100) substrate 101 doped with Fe/GaSb buffer layer 2 doped with Te/light-receiving layer having $n^+$-type MQW 21 composed of (InAs/GaSb)/light-receiving layer having n-type MQW 22 composed of (InAs/GaSb)/barrier layer 23 having bottom of conduction band higher than those of the MQWs disposed thereon and thereunder/contact layer having $n^+$-type MQW 24 composed of (InAs/GaSb)>

Out of the $n^+$-type MQW 21 and the n-type MQW 22 that form a light-receiving layer, the $n^+$-type MQW 21 including several tens of pairs, for example, 60 pairs and located on the side adjacent to the buffer layer 2 has an n-type carrier concentration of 2E18 $cm^{-3}$ or more. In this case, InAs is doped with silicon (Si), which is an n-type impurity, and GaSb is not doped. The n-type MQW 22 composed of (InAs/GaSb) and located on the $n^+$-type MQW 21 includes, for example, 100 pairs and has an n-type carrier concentration of 1E16 $cm^{-3}$. The barrier layer 23 has a wide bandgap and may be composed of AlGaSb, AlAsSb, or the like having a bottom of a conduction band higher than bottoms of conduction bands of the MQWs disposed thereon and thereunder. The barrier layer 23 is usually a single layer but may have an MQW. A contact layer on which a pixel electrode 11 is to be arranged includes, for example, about 20 pairs and is the $n^+$-type MQW 24 having a carrier concentration of 2E18 $cm^{-3}$ or more.

In the light receiving element 10 shown in FIG. 8B, only the contact layer formed of the $n^+$-type MQW 24 or the contact layer and a portion of the barrier layer are mesa-etched, thereby isolating a pixel P from a peripheral portion.

Although not shown in the figure, in the case where the pixels are arrayed, only the contact layer formed of the n⁺-type MQW 24 is mesa-etched, thereby isolating a pixel from adjacent pixels. The pixel electrode 11 is composed of a Ti/Pt/Au alloy or the like so as to establish ohmic contact with the n-type contact layer formed of the n⁺-type MQW 24. A ground electrode 12 is preferably composed of a Ti/Pt/Au alloy or the like so as to establish ohmic contact with the n⁺-type MQW 21 located to be in contact with the buffer layer 2. In the present embodiment, the pixel electrode 11 and the ground electrode 12 are each an n-side electrode.

In the light receiving element 10 according to the present embodiment, among electron-hole pairs generated by light reception, a hole that diffuses and reaches a pixel electrode is captured, thereby detecting the light reception. Since the movement of a hole to the pixel electrode is caused by diffusion, the depth of a trench of a mesa structure that isolates pixels can be reduced. As a result, a noise current flowing in a side wall of the mesa structure can be suppressed to be low.

In order to produce a detecting device, the surface is covered with an AR film, a protective film, etc., as in Embodiment 1. Furthermore, the pixel electrode 11 is electrically connected to a read-out electrode of an ROIC with bumps interposed therebetween. Ground electrodes are also electrically connected to each other.

In the present embodiment, advantages etc. achieved by providing the GaSb buffer layer 2 on the InP substrate are common to those in Embodiments 1 and 2.

EXAMPLE

The semiconductor epitaxial wafer 1a shown in FIG. 5 was prepared and verification was conducted. A method for preparing the semiconductor epitaxial wafer of Present Invention Example is as follows.

<Preparation Method>:

A GaSb buffer layer was grown on an InP substrate by an MBE method. The GaSb buffer layer was grown at a ratio VIII of 3.9 and at a substrate temperature of 400° C. so as to have a thickness of 2 μm. The growth rate was 1.1 μm/hour (about 1 ML/sec). A semiconductor epitaxial wafer prepared by the above method was observed with a metallurgical microscope, and an XRD measurement of the semiconductor epitaxial wafer was also conducted.

<Observation with Metallurgical Microscope>:

The surface of the GaSb buffer layer was a mirror surface. In addition, the surface was flat and smooth. Furthermore, no fine irregularities etc. were observed.

Figure 9:
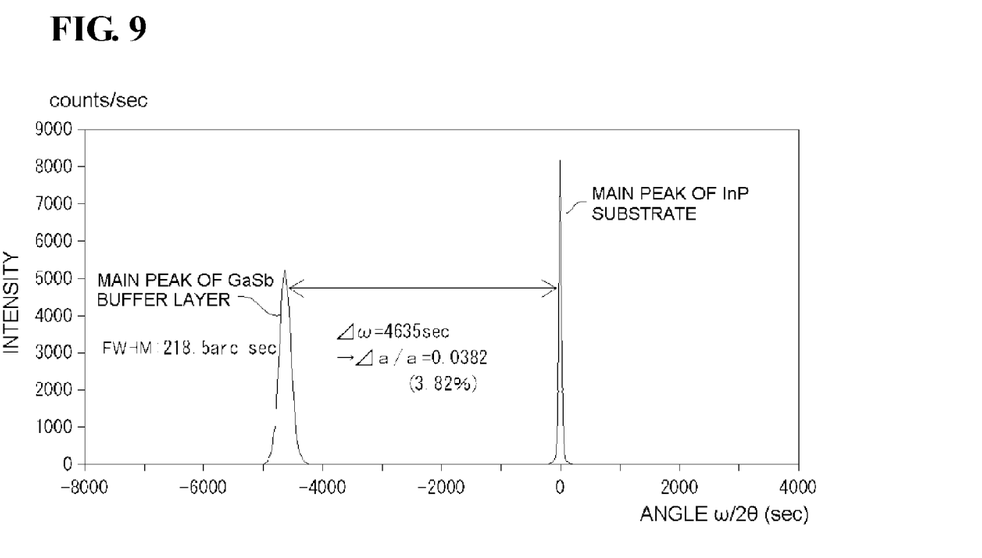
FIG. 9 is a chart showing the results of XRD of a semiconductor epitaxial wafer of Present Invention Example in Example.

<XRD>:

The results are shown in FIG. 9. FIG. 9 shows not only a sharp main peak (100) attributable to the InP substrate but also a main peak attributable to the GaSb buffer layer. Although the main peak of the GaSb buffer layer is not as good as the main peak of the InP substrate, the FWHM of the main peak of the GaSb buffer layer is 218.5 seconds, the FWHM being an index of a crystal quality. This result shows a good crystal quality. The main diffraction peak of the InP substrate and the main diffraction peak of GaSb were observed in a state where the entire surface of the InP substrate was covered with the GaSb buffer layer. Accordingly, it is believed that the main diffraction peak of the GaSb buffer layer is due to the total thickness of the GaSb buffer layer.

From the difference $\Delta u$) in the diffraction angle between the main peak of the InP substrate and the main peak of the GaSb buffer layer, $|a_2-a_1|/a_1 = \Delta a/a$ could be calculated and was 0.0382. In the case where the difference in the lattice parameter between an underlayer (InP substrate) and an upper layer (GaSb buffer layer) is large, it is usually difficult to obtain a GaSb buffer layer having a mirror surface. It is believed that a large thickness of the buffer layer provides a beneficial effect.

According to the semiconductor epitaxial wafer 1a, a light-receiving layer having a type-II MQW and having a large lattice parameter can be grown in contact with the GaSb buffer layer having a good crystal quality. This light-receiving layer has a cutoff wavelength of 3 μm or more, and the InP substrate does not absorb light in this wavelength range. In contrast, in the case where a GaSb substrate is used, the GaSb substrate has an absorption band due to a free carrier in the wavelength range. Since the substrate has a large thickness, this absorption causes a significant decrease in the responsivity. As in Present Invention Example, by using an InP substrate, the problem of the absorption by a substrate is avoided, and a high responsivity can be maintained at a wavelength of 3 μm or more.

Embodiments and Example of the present invention have been described above. The embodiments and Example of the present invention disclosed above are only illustrative, and the scope of the present invention is not limited to these embodiments of the invention. It is to be understood that the scope of the present invention is defined by the description of Claims and includes the equivalents of the description in Claims and all modifications within the scope of Claims.

Industrial Applicability

According to the light receiving element etc. of the present invention, a high responsivity can be maintained over the near- to mid-infrared region. Furthermore, since an InP substrate, which has a stable quality, which can have a large diameter, and which is excellent in terms of economical efficiency, is used as a substrate, a high quality light receiving element etc. can be provided at a low cost.

The invention claimed is:

1. A light receiving element formed by using a group III-V compound semiconductor, the light receiving element comprising:
    an InP substrate that is transparent to light having a wavelength of 3 to 12 μm;
    a buffer layer having a thickness of 2 μm or more and located in contact with the InP substrate; and
    a light-receiving layer having a multiple quantum well structure and located in contact with the buffer layer,
    wherein the light-receiving layer has a cutoff wavelength of 3 μm or more and is lattice-matched with the buffer layer,
    the buffer layer is epitaxially grown on the InP substrate while a value $|a_2-a_1|/a_1$ exceeds a range of a normal lattice-matching condition, where $a_2$ represents a lattice parameter of the buffer layer and $a_1$ represents a lattice parameter of the InP substrate,
    the buffer layer is constituted by a GaSb layer doped with Te, and the buffer layer has a carrier concentration of $1E18$ cm$^{-3}$ or more, and
    the light receiving element has a structure in which light is incident from a rear surface of the InP substrate.

2. The light receiving element according to claim 1, wherein the InP substrate that is transparent to light having a wavelength of 3 to 12 μm is an InP substrate to which sulfur (S) is not added.

3. The light receiving element according to claim 1, wherein the InP substrate that is transparent to light having a wavelength of 3 to 12 μm is an Fe-containing InP substrate or an undoped InP substrate.

4. The light receiving element according to claim 1, wherein the light-receiving layer has a p-n junction therein.

5. The light receiving element according to claim 1, wherein the light-receiving layer includes an insertion layer that is composed of a group III-V compound semiconductor and that is lattice-matched with the light-receiving layer, and a insertion layer conduction band bottom is higher than a light-receiving layer conduction band bottom.

6. The light receiving element according to claim 1, wherein the multiple quantum well structure is a type-II multiple quantum well structure selected from {(InAs/GaSb), (InAs/InGaSb), (InAsSb/GaSb), and (InAsSb/InGaSb)}.

7. A detecting device comprising the light receiving element according to claim 1; and a read-out integrated circuit (ROIC), wherein a pixel electrode in the light receiving element is connected to a read-out electrode in the ROIC with a bump interposed therebetween.

8. The light receiving element according to claim 1, wherein the buffer layer consists essentially of GaSb.

9. A semiconductor epitaxial wafer formed by using a group III-V compound semiconductor, the semiconductor epitaxial wafer comprising:
   an InP substrate that is transparent to light having a wavelength of 3 to 12 μm; and
   a buffer layer having a thickness of 2 μm or more and located in contact with the InP substrate,
   wherein a value of $|a_2-a_1|/a_1$ exceeds a range of a normal lattice-matching condition, where $a_2$ represents a lattice parameter of the buffer layer and $a_1$ represents a lattice parameter of the InP substrate, and
   the buffer layer is constituted by a GaSb layer doped with Te, and the buffer layer has a carrier concentration of $1E18$ cm$^{-3}$ or more.

10. The semiconductor epitaxial wafer according to claim 9, wherein the InP substrate that is transparent to light having a wavelength of 3 to 12 μm is an Fe-containing InP substrate or an undoped InP substrate.

11. The semiconductor epitaxial wafer according to claim 9, further comprising a first semiconductor layer including a multiple quantum well structure, the first semiconductor layer being lattice-matched with the buffer layer.

12. The semiconductor epitaxial wafer according to claim 11, wherein the multiple quantum well structure is a type-II multiple quantum well structure selected from {(InAs/GaSb), (InAs/InGaSb), (InAsSb/GaSb), and (InAsSb/InGaSb)}.

13. The semiconductor epitaxial wafer according to claim 9, wherein the buffer layer consists essentially of GaSb.

* * * * *